United States Patent
Seok

(10) Patent No.: US 11,652,167 B2
(45) Date of Patent: May 16, 2023

(54) SEMICONDUCTOR DEVICE HAVING JUNCTION TERMINATION STRUCTURE AND METHOD OF FORMATION

(71) Applicant: Littelfuse, Inc., Chicago, IL (US)

(72) Inventor: Kyoung Wook Seok, Milpitas, CA (US)

(73) Assignee: Littelfuse, Inc., Chicago, IL (US)

( * ) Notice: Subject to any disclaimer, the term of this patent is extended or adjusted under 35 U.S.C. 154(b) by 0 days.

(21) Appl. No.: 17/679,641

(22) Filed: Feb. 24, 2022

(65) Prior Publication Data

US 2022/0254921 A1    Aug. 11, 2022

Related U.S. Application Data

(62) Division of application No. 16/686,180, filed on Nov. 17, 2019, now Pat. No. 11,355,628.

(51) Int. Cl.
*H01L 29/78* (2006.01)
*H01L 29/66* (2006.01)
*H01L 29/739* (2006.01)

(52) U.S. Cl.
CPC .... *H01L 29/7811* (2013.01); *H01L 29/66348* (2013.01); *H01L 29/66734* (2013.01); *H01L 29/7397* (2013.01); *H01L 29/7813* (2013.01)

(58) Field of Classification Search
CPC .......... H01L 29/7811; H01L 29/66734; H01L 29/7813
USPC ....................................................... 257/334
See application file for complete search history.

(56) References Cited

U.S. PATENT DOCUMENTS

| | | | |
|---|---|---|---|
| 2003/0001215 A1* | 1/2003 | Wahl | H01L 29/407 257/E29.066 |
| 2006/0118864 A1* | 6/2006 | Hirler | H01L 29/7811 257/E29.027 |
| 2012/0153386 A1* | 6/2012 | Hirler | H01L 29/66734 257/334 |
| 2013/0307111 A1* | 11/2013 | Mizushima | H01L 29/0661 257/484 |
| 2015/0028415 A1* | 1/2015 | Pfirsch | H01L 29/7397 438/270 |
| 2019/0198666 A1* | 6/2019 | Kim | H01L 29/66681 |

* cited by examiner

*Primary Examiner* — Dzung Tran
(74) *Attorney, Agent, or Firm* — KDW Firm PLLC

(57) ABSTRACT

A power semiconductor device may include a junction termination region, bounded by a side edge of a semiconductor substrate. The junction termination region may include a substrate layer of a first dopant type, a well layer of a second dopant type, a conductive trench assembly having a first set of conductive trenches, in the junction termination region, and extending from above the substrate layer through the well layer; and a metal layer, electrically connecting the conductive trench assembly to the well layer. The metal layer may include a set of inner metal contacts, electrically connecting a set of inner regions of the well layer to a first set of trenches of the conductive trench assembly; and an outer metal contact, electrically connecting an outer region of the well layer to a second set of conductive trenches of the conductive trench assembly, wherein the outer region borders the side edge.

10 Claims, 13 Drawing Sheets

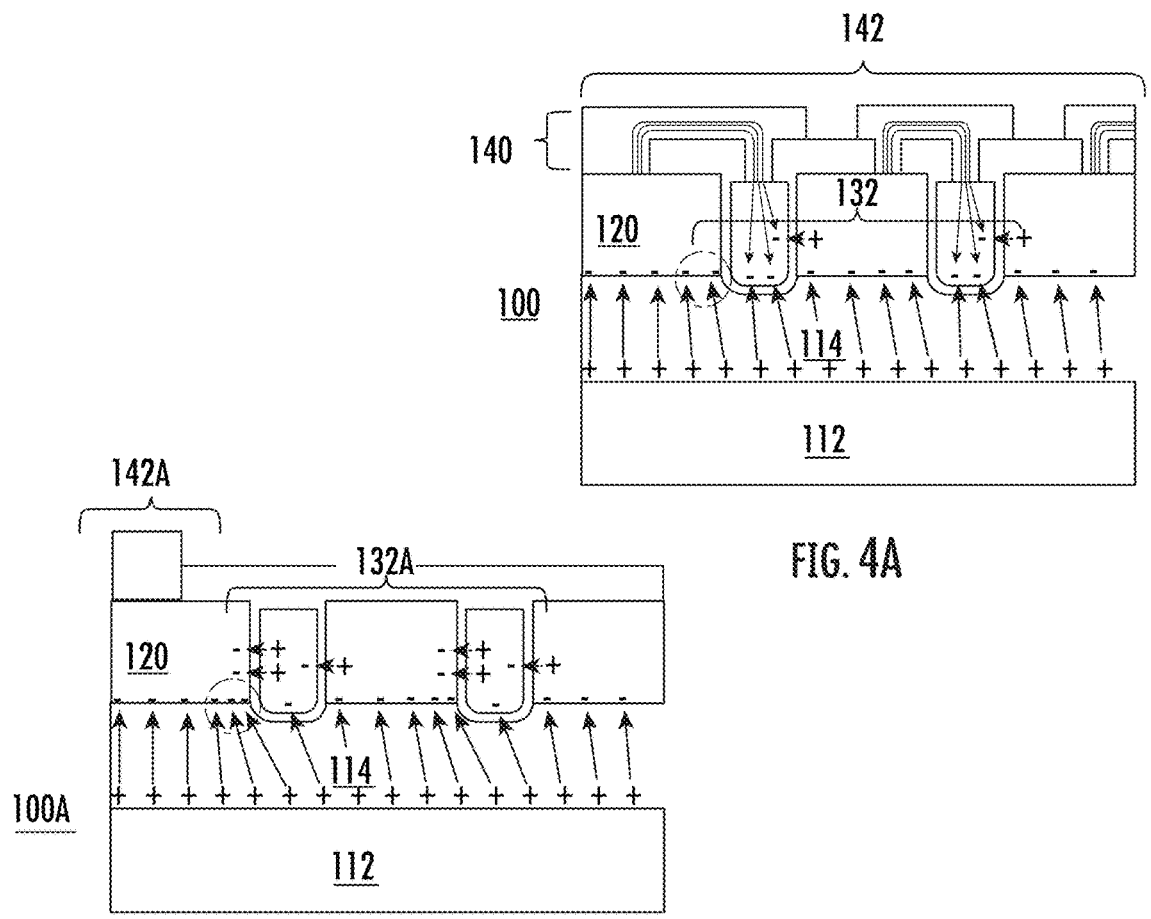
FIG. 4A
FIG. 4B
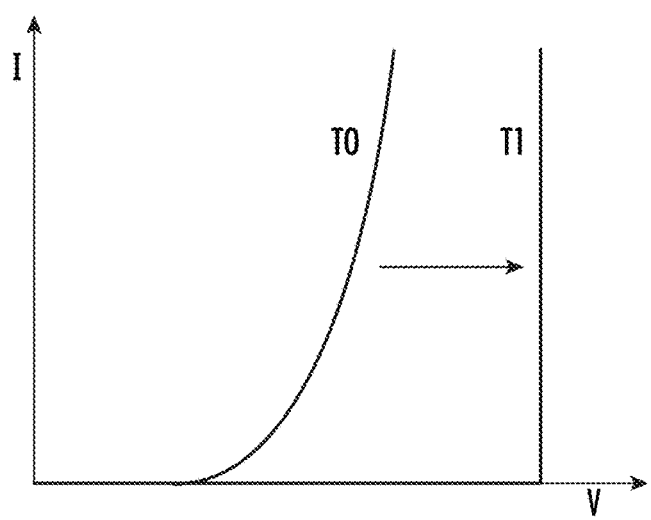
FIG. 4C

GATE OXIDATION

N+ POLY DEPOSITION

POLY ETCH BACK

N+ SOURCE IMPLANT BY MASK

INSULATION LAYER (OXIDE) DEPOSITION

CONTACT VIA ETCHING BY MASK

METAL DEPOSITION

BACK SIDE GRINDING AND ETCHING

SEMICONDUCTOR DEVICE HAVING JUNCTION TERMINATION STRUCTURE AND METHOD OF FORMATION

CROSS REFERENCE TO RELATED APPLICATION

This application is a divisional of, and claims the benefit of priority to, U.S. patent application Ser. No. 15/845,155, filed Nov. 17, 2019, entitled "Semiconductor Device Having Junction Termination Structure and Method of Formation," which application is incorporated herein by reference in its entirety.

BACKGROUND

Field

Embodiments relate to the field of power semiconductor devices, including MOSFETs and IGBTs.

Discussion of Related Art

Devices such as a power semiconductor device include insulated gate bipolar transistor (IGBT) devices and field effect transistor (MOSFET) devices. These devices may benefit from junction termination structures that terminate a planar P/N junction on an edge to prevent or reduce leakage. Without proper junction termination, a P/N junction may experience leakage current originating from defects located at the edge of a semiconductor chip containing the power device. Simple junction termination is associated with a low breakdown voltage by high electric field at junction edge, and is more severe at corner edges. One known structure that is used to reduce this problem is a so-called floating ring termination, using guard rings fabricated within a semiconductor substrate.

In known processing technology to generate power semiconductor devices having ring termination structures, a series of seven masks are used, including a ring mask to define the ring termination structures, a polysilicon mask to define gate regions of the power semiconductor device, a P$^+$ implant mask, an N$^+$ implant mask, a contact (metal) mask to provide contacts to the power semiconductor device, a metal mask, and a pad mask. Such processing approaches may generate devices having acceptable performance, at the expense of requiring a large number of mask levels.

Notably a trench MOSFET active area can be made using three mask layers—trench, contact, and metal. To make a rugged device having avalanche capability, an N$^+$ mask layer is needed. This trench junction termination can be made by a total of four mask layer process, where N$^+$ source regions are formed in or near the active area. But, to generate this structure, because the depletion region extends easily quite far, a relatively larger space on the die is required for fabrication. Accordingly, in many cases, a floating ring junction termination structure is used. However, the floating ring junction termination structure will employ an additional mask layer-p-well or ring.

In view of the above considerations, the present embodiments are provided.

BRIEF SUMMARY

In one embodiment, a power semiconductor device may include a semiconductor substrate, comprising an active device region and a junction termination region, wherein the junction termination region is bounded by a side edge of the semiconductor substrate. The junction termination region may include a substrate layer formed of a first dopant type, a well layer, disposed on the substrate layer, and formed of a second dopant type, a conductive trench assembly, disposed in the junction termination region, and comprising a plurality of conductive trenches, and extending from above the substrate layer and through the well layer; and a metal layer, electrically connecting the conductive trench assembly to the well layer. The metal layer may include a set of inner metal contacts, electrically connecting a set of inner regions of the well layer to a first set of trenches of the conductive trench assembly; and an outer metal contact, the outer metal contact electrically connecting an outer region of the well layer to a second set of conductive trenches of the conductive trench assembly, wherein the outer region borders the side edge.

In another embodiment, a method of forming a power semiconductor device, may include providing a semiconductor substrate, comprising a first dopant type, forming a well layer on the semiconductor substrate, comprising a second dopant type, and forming a conductive trench assembly, comprising a plurality of junction termination trenches within the semiconductor substrate, the plurality of junction termination trenches extending through the well layer. The method may include forming a metal layer, electrically connecting the trench assembly to the well layer. The metal layer may include a set of inner metal contacts, electrically connecting a set of inner regions of the well layer to a first set of trenches of the conductive trench assembly; and an outer metal contact, the outer metal contact electrically connecting an outer region of the well layer to a second set of trenches of the conductive trench assembly, wherein the outer region borders the side edge.

In a further embodiment, a method of forming a power semiconductor device in a semiconductor substrate may include providing a semiconductor layer stack, comprising: a semiconductor substrate layer, comprising a first dopant type; a well layer, disposed on the semiconductor substrate, and comprising a second dopant type, wherein the well layer is bounded by a side edge of the semiconductor substrate. The method may include forming a conductive trench assembly, comprising a plurality of conductive trenches by etching the semiconductor layer stack using a trench mask, the plurality of conductive trenches comprising an outermost trench, proximate the side edge. The method may also include forming a plurality of metal vias, coupled to the conductive trench assembly, using a metal via mask; and forming a metal layer to electrically connect the plurality of conductive trenches to the well layer using a metal mask, the metal layer comprising an outer metal contact, electrically connecting an outer region of the well layer to an outer set of conductive trenches of the conductive trench assembly, wherein the outer region borders the side edge.

BRIEF DESCRIPTION OF THE DRAWINGS

FIG. 4A shows a side cross-section view of conductive trenches adjacent inner metal contacts in a power semiconductor device according to various embodiments of the disclosure;

FIG. 4B shows a side cross-section view of floating conductive trenches in a power semiconductor device;

FIG. 4C shows current voltage characteristics of the device of FIG. 4B, initially (left curve) and after an elapsed time where leakage current enters the conductive trenches (right curve);

DESCRIPTION OF EMBODIMENTS

Figure 1A:
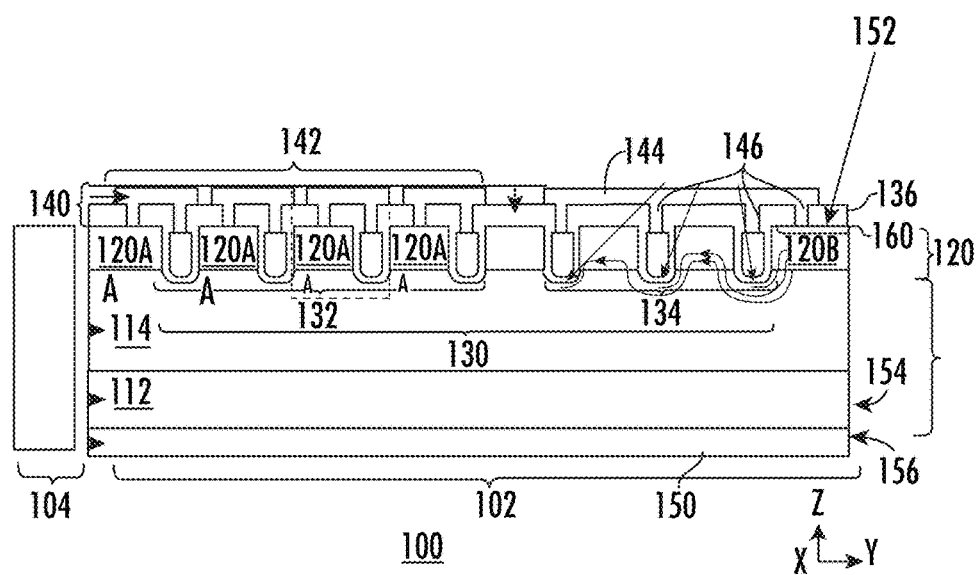
FIG. 1A shows a side cross-section view of a portion of a power semiconductor device according to various embodiments of the disclosure.

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on," and "over", may mean that two or more elements are not in direct contact with one another. For example, "over" may mean that one element is above another element while not contacting one another and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

The present embodiments provide novel device structures and methods of fabrication of power semiconductor devices. As detailed below, a power semiconductor device may be provided with a novel guard ring structure, which structure may be referred to herein as a junction termination structure. Generally, in accordance with various embodiments of the disclosure, a power semiconductor device may include an active device region and a junction termination region formed within a semiconductor die (substrate), also referred to as a semiconductor chip. Exemplary power semiconductor devices may include a power MOSFET or IGBT, where the semiconductor device may be bounded by a junction termination region disposed toward an edge of the semiconductor chip.

In various embodiments, a conductive trench assembly is provided in the junction termination region, where the conductive trench assembly is formed from a plurality of conductive trenches, such as a plurality of polysilicon trenches. In various embodiments a conductive trench assembly includes a first set of conductive trenches formed in an inner region of the conductive trench assembly and a second set of conductive trenches formed in an outer region of the conductive trench assembly. As detailed below, the second set of conductive trenches may be formed from a plurality of conductive trenches, such as two or more $N^+$ polysilicon trench rings that are connected to an outside region of a P-well a metal contact structure of a metal layer, also referred to herein as a metal layer. In accordance with various embodiments, the polysilicon trench rings may be set at a higher potential than the potential underneath an N-epitaxial layer, below the polysilicon trench rings, according to a work function difference. In this manner, an electric field is exerted in the direction of pushing holes that may be generated in the semiconductor substrate, especially holes that may be generated at a side edge of the semiconductor substrate (chip).

Moreover, the first set of conductive trenches formed in an inner region of the conductive trench assembly, may be arranged wherein each conductive trench in the first set is electrically connected to a portion of a P-well. As detailed below, the combination of the inner region and outer region of the conductive trench assembly may provide overall beneficial properties with respect to known approaches. For example, the device design and arrangement of the present embodiments enables the formation a trench junction termination structure in a more compact space as compared to known technology.

In accordance with further embodiments of the disclosure, a novel semiconductor device may be assembled using just three mask levels, such as a trench mask, contact via mask, and metal mask.

Figure 1B:
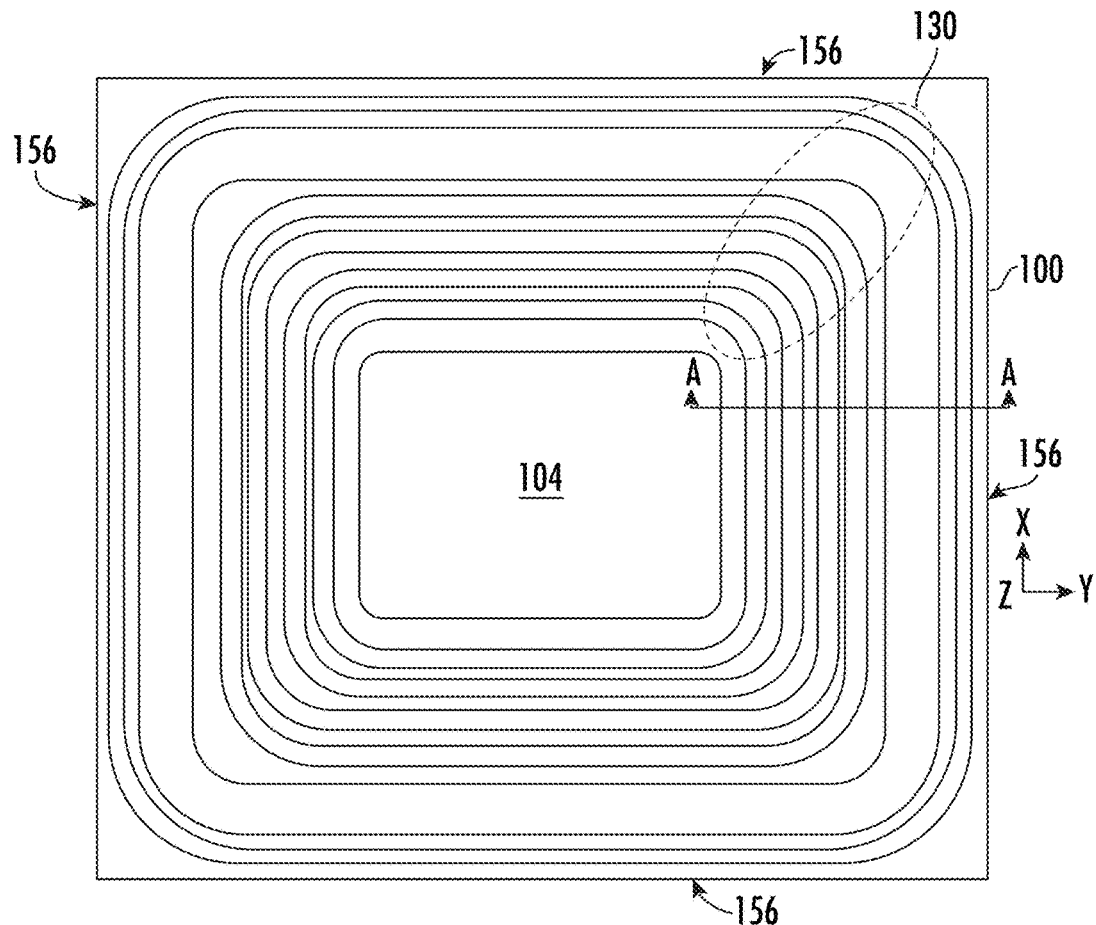
FIG. 1B shows a top plan view of the power semiconductor device according to FIG. 1A.

Turning to FIGS. 1A-1B there is shown a power semiconductor device 100, according to embodiments of the disclosure. Notably, FIG. 1A shows a side cross-section view of a portion of a power semiconductor device according to various embodiments of the disclosure, while FIG. 1B shows a top plan view of the power semiconductor device according to FIG. 1A. More particularly, FIG. 1A shows a view along the section A-A of FIG. 1B.

The power semiconductor device 100 may include a junction termination region 102 that bounds an active device region 104. In embodiments where power semiconductor device 100 represents a MOSFET, the active device region 104 may include at least one MOSFET. The power semiconductor device 100 is arranged in a series of layers, include a layer stack 110, formed of a first dopant type. The layer stack 110 may be formed of N-type dopant, including a substrate layer 112, and epitaxial layer 114, where the substrate layer 112 may be formed of $N^+$ doping concentration in the range of $1E18/cm^2 \sim 1E20/cm^2$, and the epitaxial layer of $N^-$ doping concentration in the range of $1E14/cm^2 \sim 1E17/cm^2$. The power semiconductor device 100 may include a back metal contact 150, formed to contact the substrate layer 112, as in known power semiconductor devices.

On top of the layer stack 110, a well layer 120 is disposed, formed of a second dopant type, opposite the first dopant type. Thus, in embodiments of an N-type substrate, the well layer 120 is formed of a net P-type doping.

As shown in FIG. 1A, a conductive trench assembly 130 is provided, disposed in the junction termination region 102, and comprising a plurality of conductive trenches. Notably, the arrangement shown in FIG. 1B presents a generalized picture showing conductive trenches without any contacts, where the conductive trench assembly 130 is arranged around the active device region 104.

The conductive trench assembly 130 extends from above the layer stack and through the well layer 120. The conductive trench assembly 130 may be formed of polysilicon ring-shaped trenches in some embodiments. As used herein, unless otherwise noted, the term "conductive trench" may refer to a trench-shaped structure that as filled with a conductive material. Thus, the conductive trench is a filled trench, as opposed to a cavity like structure.

As further shown in FIG. 1A, the power semiconductor device 100 may include an insulator layer 136, disposed over the well layer 120. The power semiconductor device 100 may further include a metal layer 140, electrically connecting the conductive trench assembly 130 to the well layer 120. Note that the insulation layer 136 is thinner at the side and bottom regions of the conductive trench.

In the illustration of FIG. 1A, a side edge 156 of the semiconductor substrate (semiconductor chip) forming the power semiconductor device 100 is shown along a right side. Notably, as shown in FIG. 1B a similar side edge (parallel to the X-X plane of the Cartesian coordinate system shown) may be formed along a left side (not shown), as well as front and back side edges of the semiconductor chip (not shown) that are disposed in front of and behind the cross-sectional Y-Z plane of FIG. 1A. Thus, the active device region 104 may be bounded by four side edges, in accordance with embodiments of the disclosure. Notably, these side edges may be formed by scribing and dicing of a semiconductor wafer, the generate a generally vertical set of side edges (parallel to the Z-axis).

These set of side edges may represent a source of electronic carriers including electrons 152 and holes 154, as shown in FIG. 1A. In accordance with embodiments of the disclosure, the metal layer 140 is configured in a novel manner to couple various conductive trenches to the well layer 120, to counter leakage current that may result from the holes 154, for example. In particular, the metal layer 140 may be arranged in the junction termination region 102 as a series of metallic rings, surrounding the active device region 104 (in plan view in the X-Y plane). The metal layer 140 may include, for example, a set of inner metal contacts 142, electrically connecting a set of inner regions 120A of the well layer 120 to a first set of conductive trenches 132 of the conductive trench assembly 130. While shown as four inner metal contacts, in various non-limiting embodiments, many more inner metal contacts may be provided such as 10 inner metal contacts, 20 inner metal contacts, and so forth.

As further shown in FIG. 1A, the metal layer 140 may include an outer metal contact 144, electrically connecting an outer region 120B of the well layer 120 to a second set of conductive trenches 134 of the conductive trench assembly 130, by way of the contact vias 146. In accordance with the present embodiments, by electrically connecting the outer region 120B of the well layer 120 to an appropriate number of conductive trenches, the holes 154 may be blocked from generating unacceptable levels of leakage current in the power semiconductor device 100. As a result, the breakdown voltage of the power semiconductor device 100 may be maintained at a target level for a given power MOSFET structure, for example.

Figure 1C:
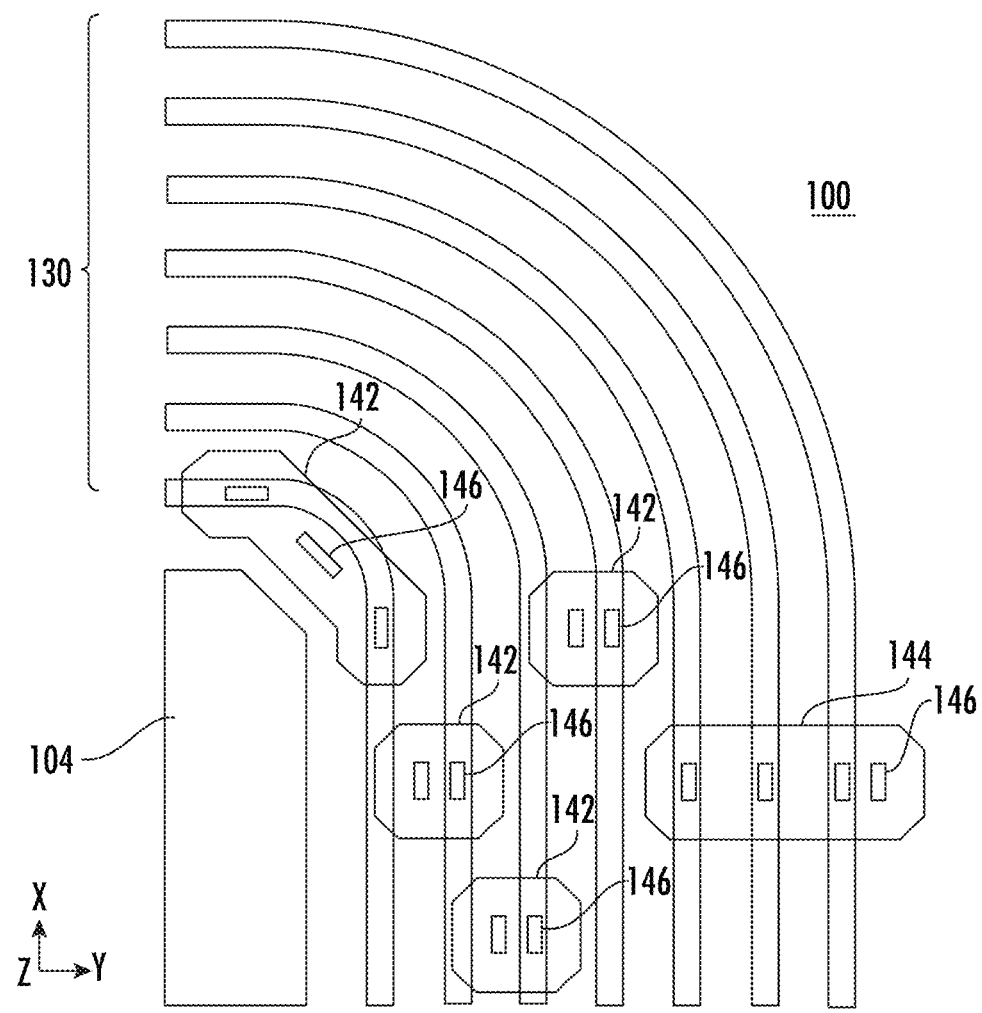
FIG. 1C shows a top plan view of a portion of the power semiconductor device according to FIG. 1A.

As further shown in FIG. 1C, the first set of conductive trenches 132 and second set of conductive trenches 134 may be arranged as a series of concentric trenches. As shown in FIG. 1C, the inner metal contacts 142 may be arranged in staggered fashion with respect to one another and the outer contact 144 may also be staggered with respect to the nearest of inner metal contacts 142, to allow for convenient placement of contacts. Additionally, by staggering the placement of the contacts along the X-axis, the contact width, such as along the Y-direction, may exceed the distance between adjacent trenches without overlapping of adjacent contacts.

Notably, because the metal connecting p-well regions and trenches conducts a very small current, the contact structure as shown in FIG. 1C need just be placed in a few regions within a whole chip. For example, with respect to FIG. 1C, the structure of inner metal contacts 142 and outer metal contact 144 may be placed at each of four corner regions of a chip, in accordance with one embodiment. The use of just a few regions for the placement of the inner metal contacts 142 and outer metal contact 144 also helps reduce the possibility of failure that may occur with a design having two many contacts. For example, when a dust particle alights over a metal gap between metal contacts, an electrical short may occur.

Figure 2A:
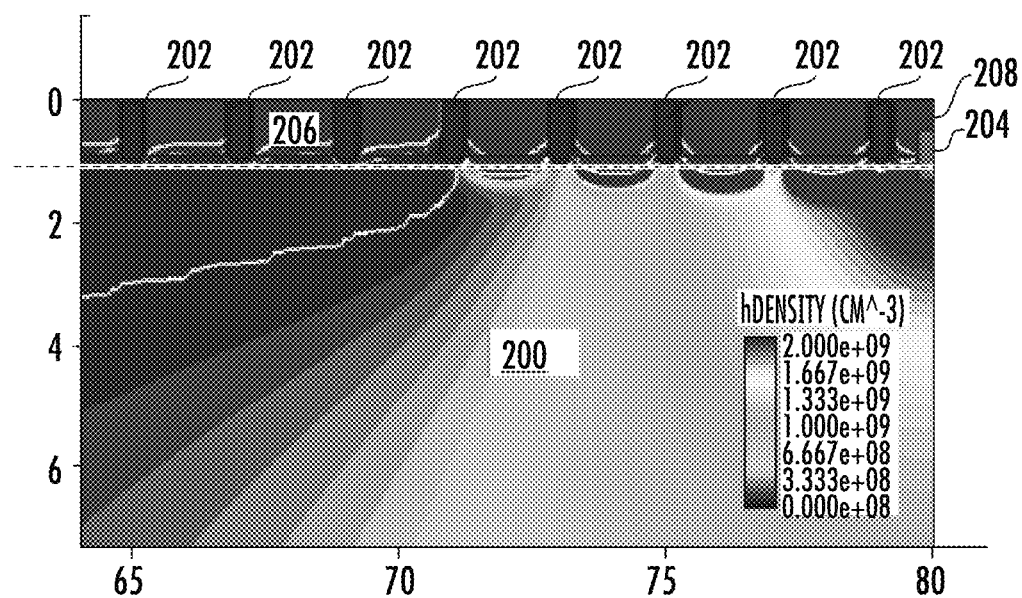
FIG. 2A shows two dimensional simulation of hole density in a power semiconductor device, arranged in accordance with embodiments of the present disclosure.

To further explain operation of the present embodiments, FIG. 2A shows a two dimensional simulation of hole density in a power semiconductor device. In this example, right upper side of a cross-section of a semiconductor substrate is shown in a junction termination region. A metal piece 204 is shown adjacent an outer region 208 of a layer 206 on the upper right of a substrate 200. The metal piece 204 is meant to simulate a scribed side edge of a substrate, acting as a source of electronic (hole and electron) defects. A series of seven conductive trenches 202 are shown, arranged along the top surface of the substrate 200, extending through a layer 206, representing a P-well layer. As shown, the hole density decreases from upper right to lower left, decreasing to zero from maximum values in the range of 1 E9/cm$^3$.

Figure 2B:
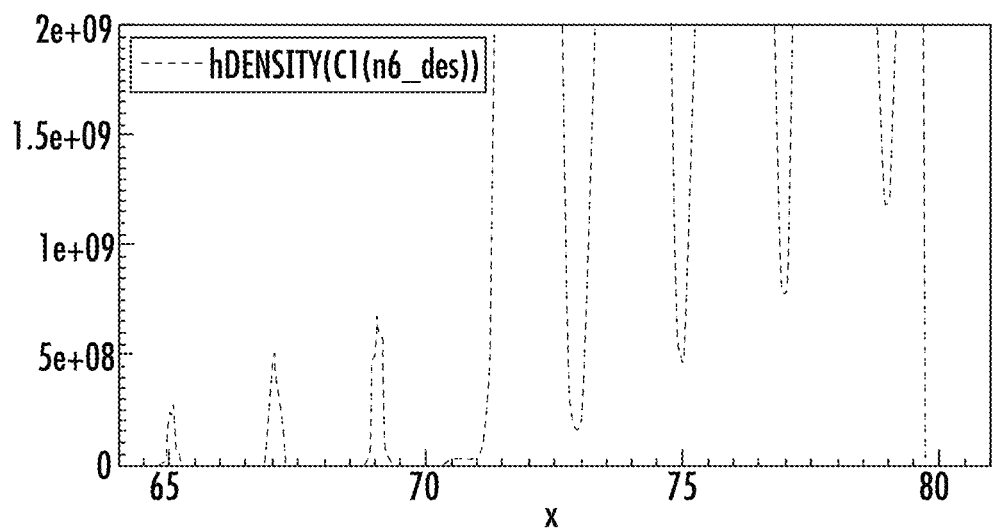
FIG. 2B shows one dimensional simulation of hole density in the power semiconductor device of FIG. 2A.

FIG. 2B shows one dimensional simulation of hole density along the dashed line of FIG. 2A as a function of X position in the power semiconductor device of FIG. 2A. As shown, the hole current density (in the valleys) decreases to zero at the position corresponding to X=47.

Figure 3:
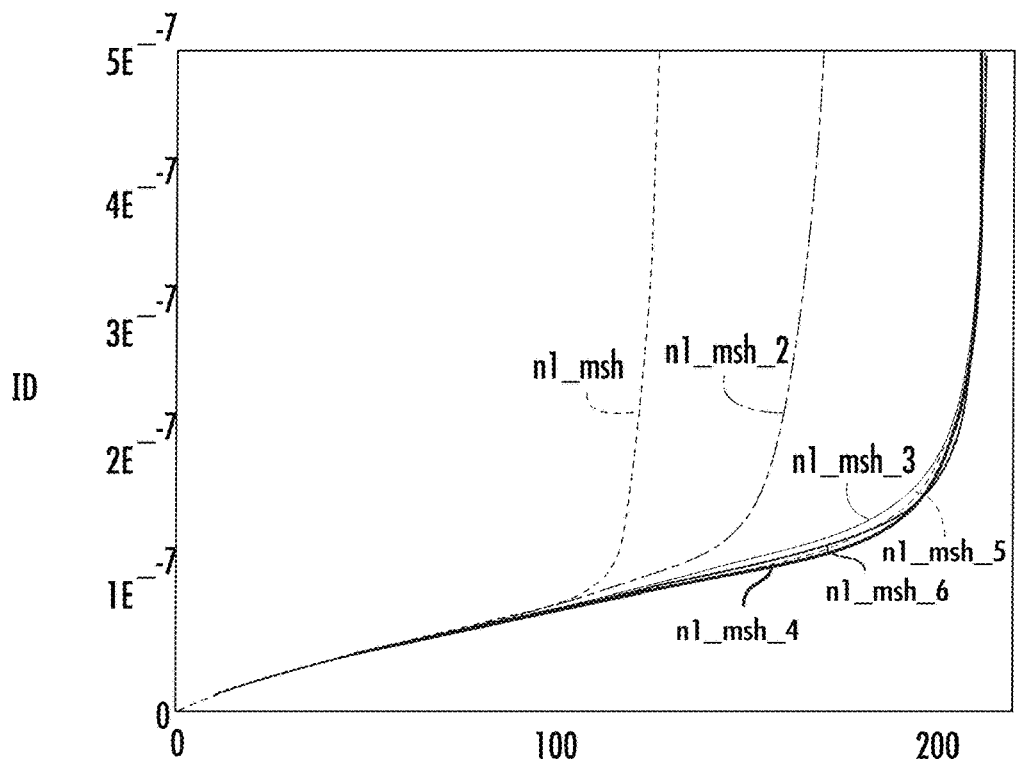
FIG. 3 shows a series of curves depicting exemplary drain current as a function of voltage for different configurations of outer metal contacts for a power semiconductor device.
Figure 3A:
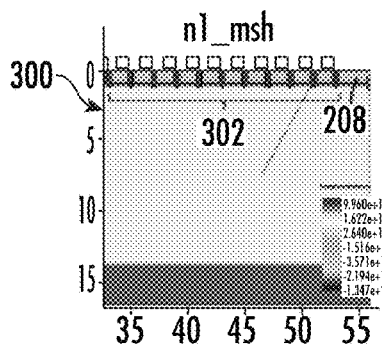
FIGS. 3A-3F depict the different configurations of an outer metal contacts in a power semiconductor device, corresponding to the curves of FIG. 3.

Unexpectedly, simulations have shown that by electrically connecting a certain small number of conductive trenches to an outer region, such as outer region 208, the hole current may be suppressed and device performance improved. FIG. 3 shows a series of curves depicting exemplary drain current as a function of voltage for different configurations of outer metal contacts for a power semiconductor device. FIGS. 3A-3F depict the different configurations of outer metal contacts in a power semiconductor device 300, corresponding to the curves of FIG. 3. In particular, in FIG. 3, the drain current ($I_D$) of a MOSFET device is shown as a function of source/drain voltage for configurations where an outer region 208 of a well layer is electrically connected to conductive trenches 302. In FIG. 3A a configuration is shown where the outer region 208 is not electrically connected to any of the conductive trenches 302. The resulting drain current curve is shown in the leftmost curve of FIG. 3, where drain current increases rapidly at approximately 120 V, a result of leakage, including hole current.

Figure 3B:
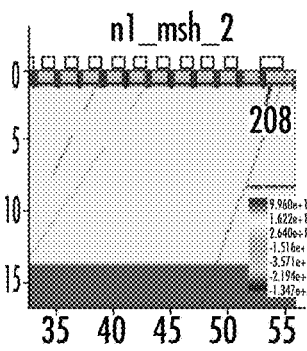

In FIG. 3B, a configuration is shown where the outer region 208 is electrically connected to one outermost conductive trench of the conductive trenches 302. The resulting drain current curve is shown in the second leftmost curve of FIG. 3, where drain current increases rapidly at approximately 160 V, indicating lower leakage from lower hole current.

Figure 3C:
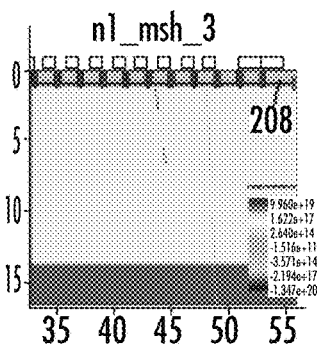

In FIG. 3C, a configuration is shown where the outer region 208 is electrically connected to the two outermost conductive trenches of the conductive trenches 302. The resulting drain current curve is shown in FIG. 3, where drain current increases rapidly at approximately 210 V, indicating a much lower leakage from lower hole current.

Figure 3D:
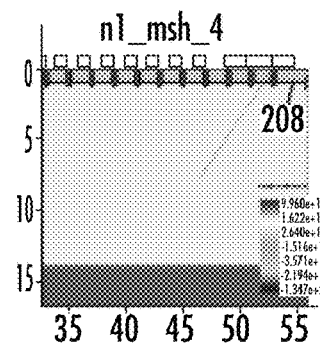

In FIG. 3D, a configuration is shown where the outer region 208 is electrically connected to the three outermost conductive trenches of the conductive trenches 302. The resulting drain current curve is shown in FIG. 3, where drain current again increases rapidly at approximately 210 V, exhibiting behavior similar to the configuration of FIG. 3C.

Figure 3E:
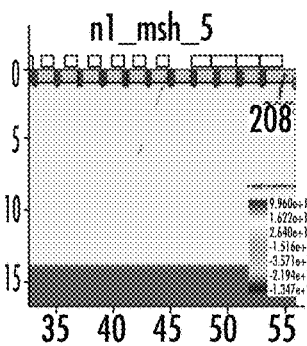

In FIG. 3E, a configuration is shown where the outer region 208 is electrically connected to the four outermost conductive trenches of the conductive trenches 302. The resulting drain current curve is shown in FIG. 3, where drain current again increases rapidly at approximately 210 V, exhibiting behavior similar to the configuration of FIG. 3C and FIG. 3D.

Figure 3F:
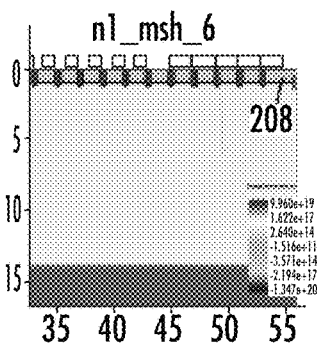

In FIG. 3F, a configuration is shown where the outer region 208 is electrically connected to the four outermost conductive trenches of the conductive trenches 302. The resulting drain current curve is shown in FIG. 3, where drain current again increases rapidly at approximately 200 V, indicating somewhat worse performance that the configuration of FIG. 3C and FIG. 3D and FIG. 3E.

In accordance with the above results, by electrically connecting an outermost region of a well layer, adjacent a side edge of a semiconductor device, to a small number of conductive trenches, near the outermost region, the breakdown voltage of a power semiconductor device may be substantially improved. While the above results suggest that electrically coupling two to four conductive trenches to an outermost region of a well layer may produce optimum results, the exact number of trenches to generate best results may vary depending upon factors, such doping concentration of N⁻ epi layer, thickness of N⁻ epi layer, as well as size and spacing of conductive trenches.

To illustrate further advantages of a conductive trench assembly approach of the present embodiments, FIG. 4A and FIG. 4B present a comparison of a floating trench arrangement as well as an arrangement according to the present embodiments, where the trenches are electrically connected to the P-well. In FIG. 4A, a portion of the power semiconductor device 100 including the inner metal contacts 142 is shown, coupled to the first set of conductive trenches 132, that is, to inner trenches. As shown in FIG. 4A, during operation, elections (−charges) traverse (in a U-shaped path) from a p-well region and come to the edges of a given trench that is filled, for example, with polysilicon, and may thus relieve an otherwise high electric field from forming at the PN junction edge.

In FIG. 4B, in a known arrangement 110A, a high electric field that exists without conductive trenches may be somewhat reduced by the presence of the conductive trenches 132A that are floating and not electrically connected to a well layer 120. In this case, zero net charge exists in the conductive trenches, so that the PN-junction edge experiences a higher electric field than in the embodiment of FIG. 4A.

During operation, leakage current will enter through thin oxide, as electrons comes into the trenches. The electrons relieve some electric field and a high electric field of the PN-junction edge is partially relieved. Notably, experiments have shown that initially (T0) such structures as in FIG. 4B exhibit a low soft breakdown, shown in the left curve of FIG. 4C. This breakdown behavior eventually transitions to a solid high breakdown behavior (at time T1) shown in the right curve. This behavior is believed to be caused by the charging of the conductive trenches through leakage current, such that once the conductive trenches are charged, the device will exhibit good breakdown behavior. However, retention of the negative charge in the conductive trenches may be unstable. The issues of FIG. 4C are thus avoided by the embodiment of FIG. 4A.

In accordance with various embodiments of the disclosure, a junction termination region of a power semiconductor device, such as the power semiconductor device 100 may be fabricated using three mask levels. This simplified approach provides the ability to reduce the required number of mask layers and/or the ability to reduce the space needed to form junction termination structure.

Figure 5A:
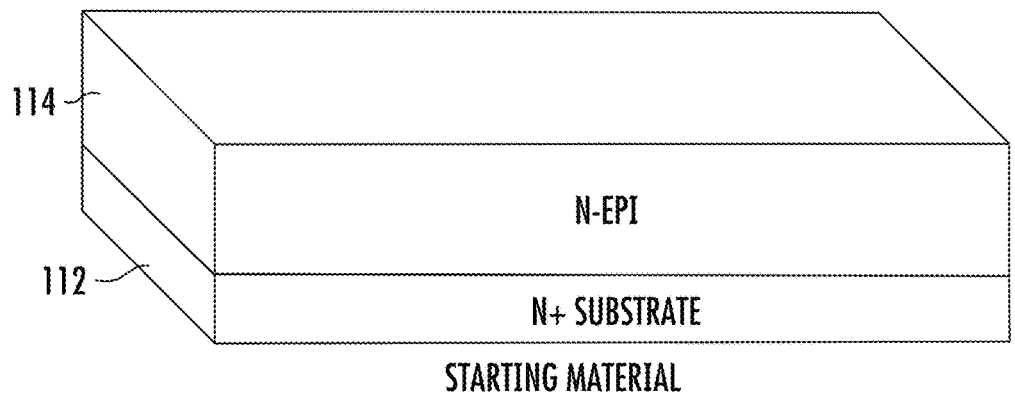
FIGS. 5A-5N show a side view of a semiconductor substrate at various stages of fabrication, according to embodiments of the disclosure.

Turning to FIG. 5A there is shown a first instance of formation of a semiconductor device according to embodiments of the disclosure. In FIG. 5A, a substrate layer 112 is provided as an N⁺ semiconductor (such as silicon) layer, upon which layer an N⁻ epitaxial layer (epitaxial layer 114) is grown. In one non-limiting embodiment, an exemplary thickness of the N-epitaxial layer may be 14 µm, while a doping level is $1.2E15/cm^3$.

Figure 5B:
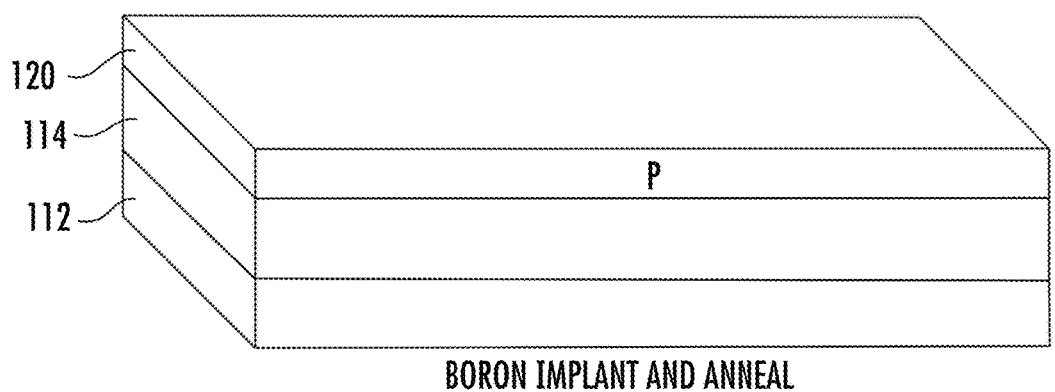

Turning to FIG. 5B there is shown a subsequent instance of fabrication of the semiconductor device of FIG. 5A, where the well layer 120 is formed as a P layer, upon the epitaxial layer 114. Note that the well layer 120 may be formed in the original top portion of the epitaxial layer 114, by ion implantation and annealing, for example.

Figure 5C:
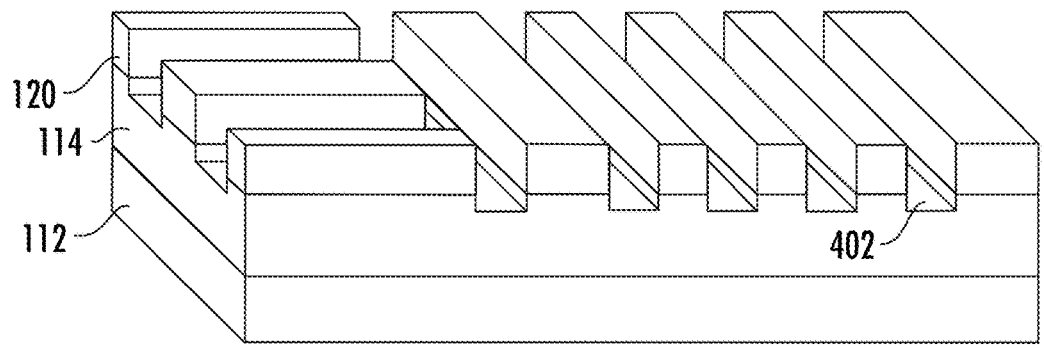

Turning to FIG. 5C there is shown a subsequent instance of fabrication of the semiconductor device of FIG. 5B, where trenches 402 are formed within the well layer 120, and extending into the epitaxial layer 114. The trenches 402 may be formed by depositing an oxide layer (not shown) on the well layer 120, forming a trench mask, over the oxide layer, such as using a photoresist layer (not shown). The oxide layer may then be etched in the pattern of the trench mask, and the photoresist (trench mask) may then be removed. Subsequently, the trench mask pattern in the oxide layer may be used to etch the underlying layers, well layer 120 and epitaxial layer 114.

Figure 5D:
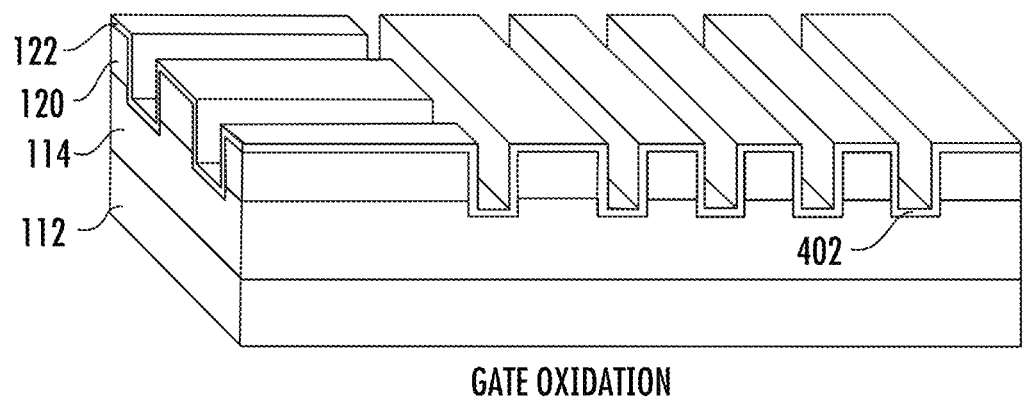

Turning to FIG. 5D there is shown a subsequent instance of fabrication of the semiconductor device of FIG. 5C, where a gate oxide layer 122 is formed on the patterned well layer and trenches 402.

Figure 5E:
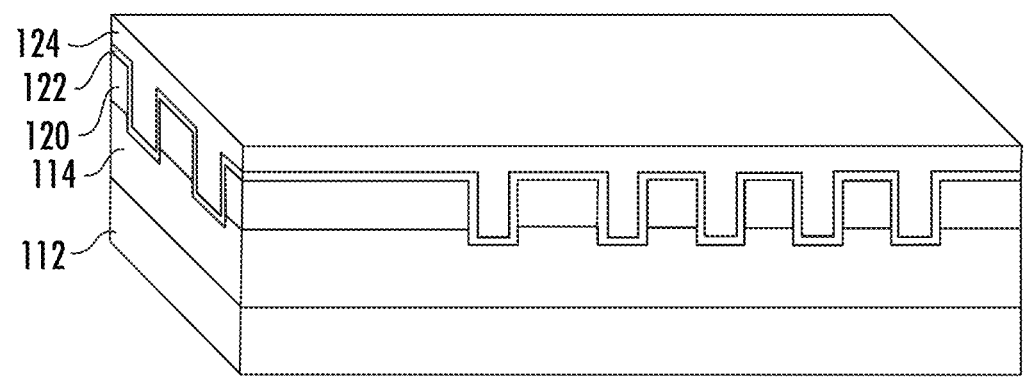

Turning to FIG. 5E there is shown a subsequent instance of fabrication of the semiconductor device of FIG. 5D, where a conductive layer 124 is deposited to fill the trenches 402, where the conductive layer 124 may be N+ polysilicon in various embodiments.

Figure 5F:
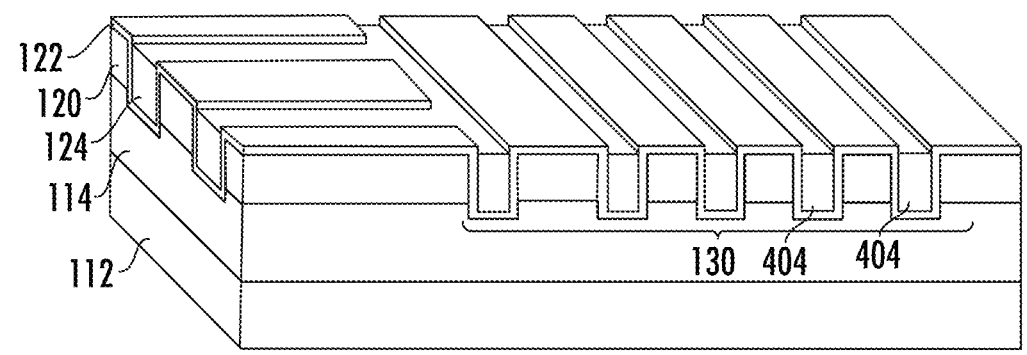

Turning to FIG. 5F there is shown a subsequent instance of fabrication of the semiconductor device of FIG. 5E, where the conductive layer 124 is etched back, exposing the gate oxide layer 122, and forming trench conductors 404, filling the trenches 402. Thus, the trenches 402, filled with trench conductors 404, now form a conductive trench assembly 130.

Figure 5G:
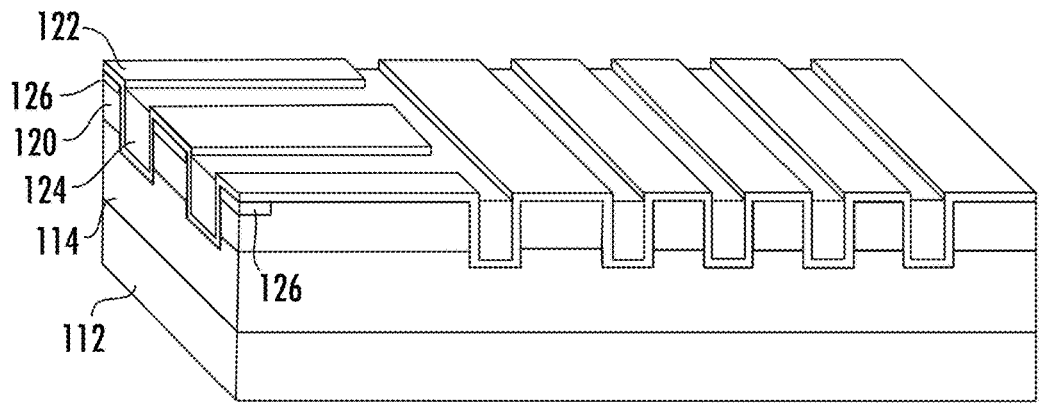

Turning to FIG. 5G, there is shown a subsequent instance, after the instance of FIG. 5F, where source regions 126 are formed in the substrate. The source regions 126 may be formed by implantation through an implant mask (not shown) that is subsequently removed. These source regions 126 are formed in an active device region 104 (see FIG. 1), where the source regions 126 may be N+ silicon is various embodiments where the well layer is P silicon.

Figure 5H:
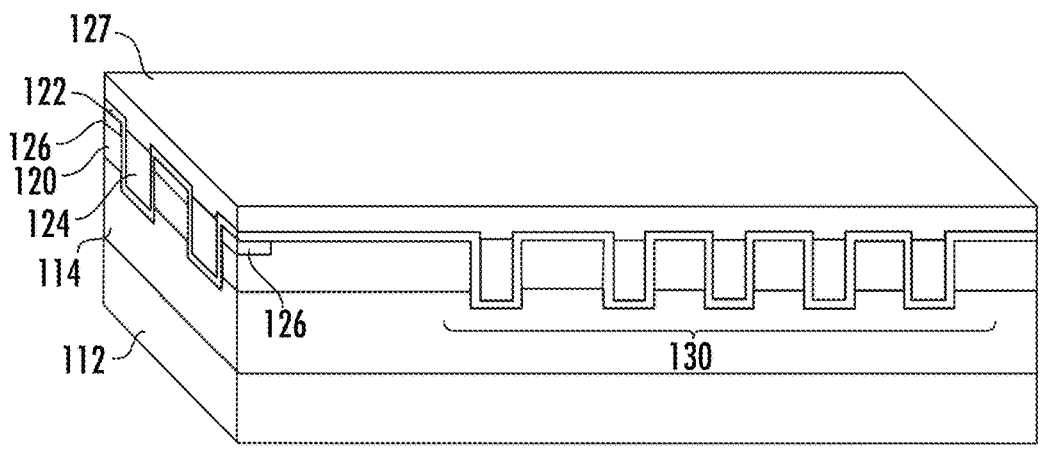

Turning to FIG. 5H, there is shown a subsequent instance after FIG. 5G where an insulator layer 127 is deposited as a blanket layer over the substrate of FIG. 5G.

Figure 5I:
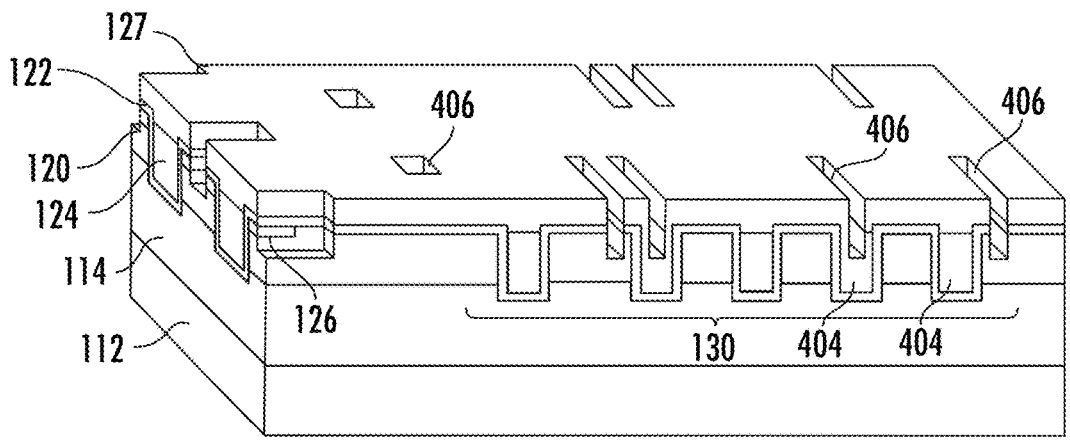

Turning to FIG. 5I there is shown a subsequent instance after FIG. 5H where an insulator layer 127, and portions of the well layer 120 and trench conductors 404 are etched. The etching is performed in the presence of a contact mask (not shown), to pattern the insulator layer 127 and form a set of contact vias 406 as shown. As noted, the contact vias 406 may extend through the insulator layer 127 and into portions of the well layer 120 and trench conductors 404. The contact mask is subsequently removed before the instance of FIG. 5I.

Figure 5J:
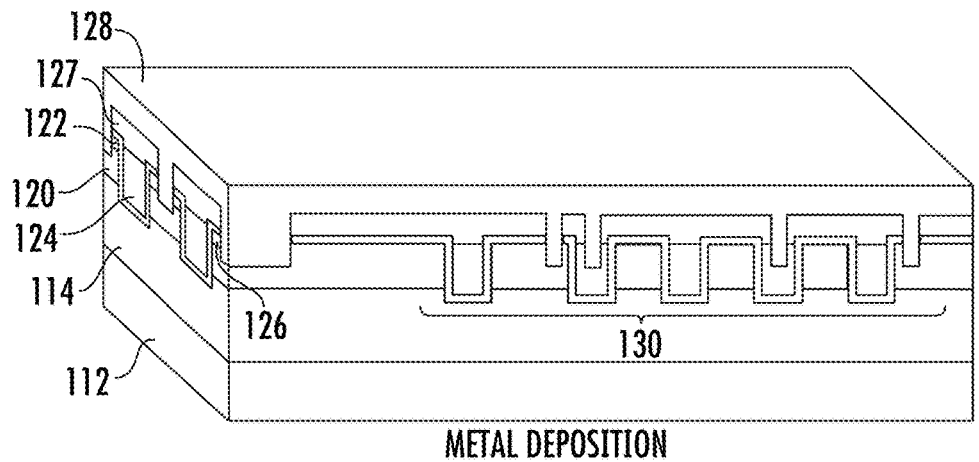

Turning to FIG. 5J there is shown a subsequent instance after FIG. 5I where a blanket metal layer 128 is deposited over the insulator layer 127. The blanket metal layer 128 may extend into the contact vias 406 as shown, thus forming an electrical contact to the conductive trench assembly 130 and to portions of the well layer 120.

Figure 5K:
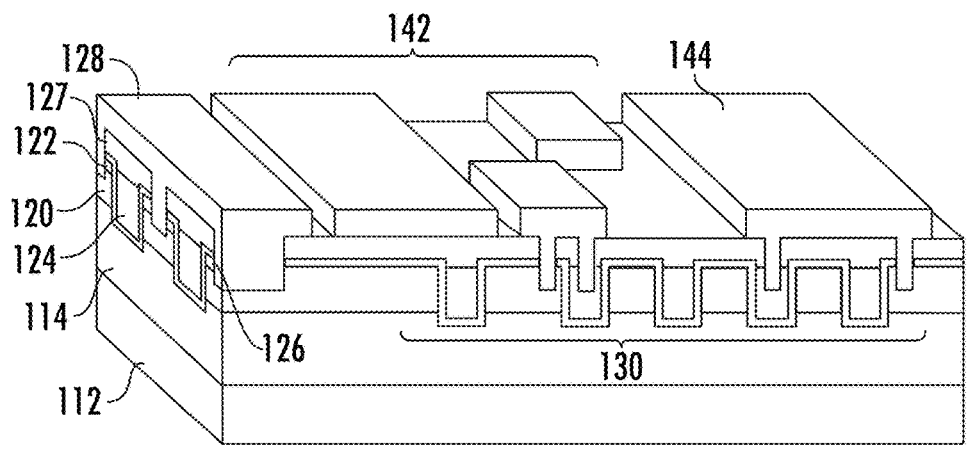

Turning to FIG. 5K there is shown a subsequent instance after FIG. 5J where the blanket metal layer 128 is patterned using a metal mask (not shown) to form inner metal contacts 142 and outer metal contact 144. The metal mask is subsequently removed before the instance of FIG. 5K.

Figure 5L:
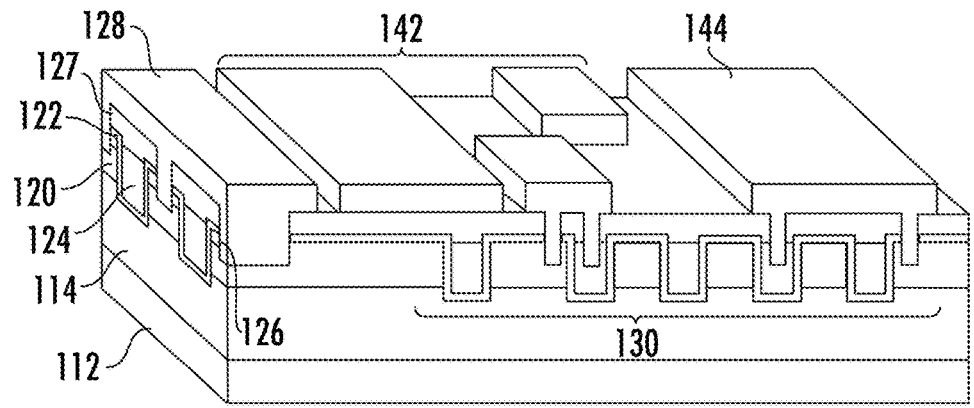

Turning to FIG. 5L there is shown a subsequent instance after FIG. 5K where a portion of the substrate layer 112 is removed, for example, by grinding.

Figure 5M:
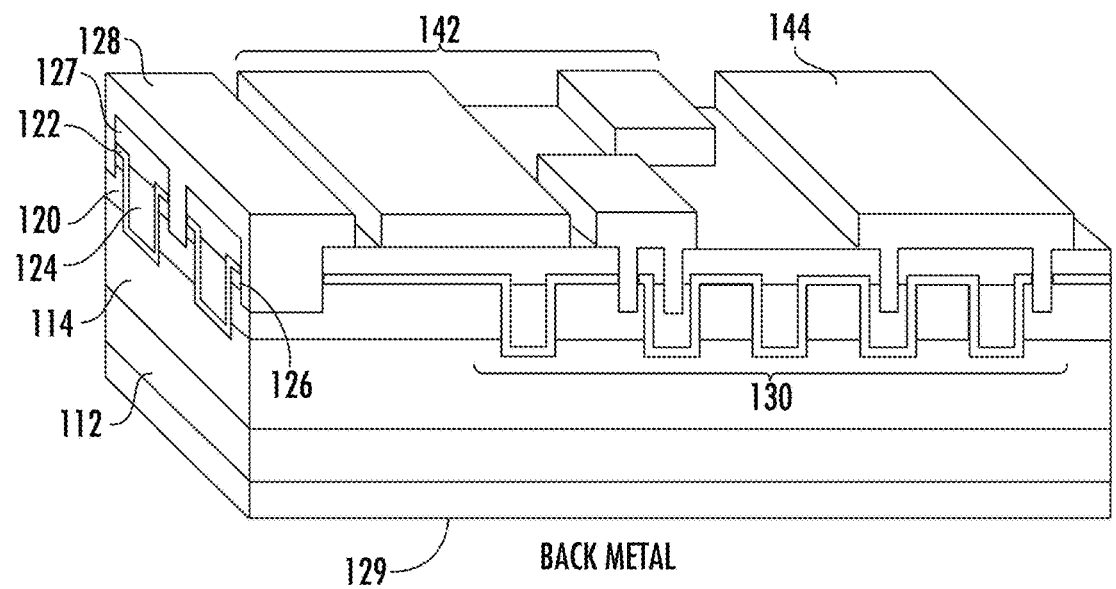

Turning to FIG. 5M there is shown a subsequent instance after FIG. 5L where a backside metal layer 129 is formed on the substrate layer 112.

Figure 5N:
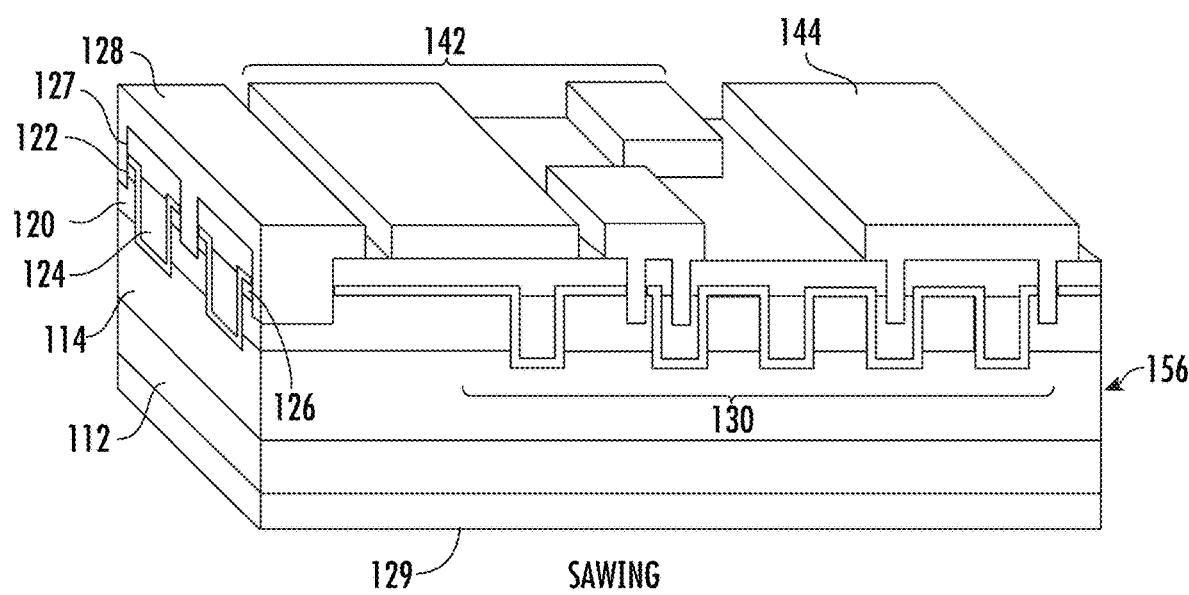

Turning to FIG. 5N there is shown a subsequent instance after FIG. 5M where the substrate is sliced into individual semiconductor die, forming the side edge 156.

Notably, in the sequence of FIGS. 5A-5N just four mask levels are used to fabricate the semiconductor device, including the N+ implant mask.

Figure 6:
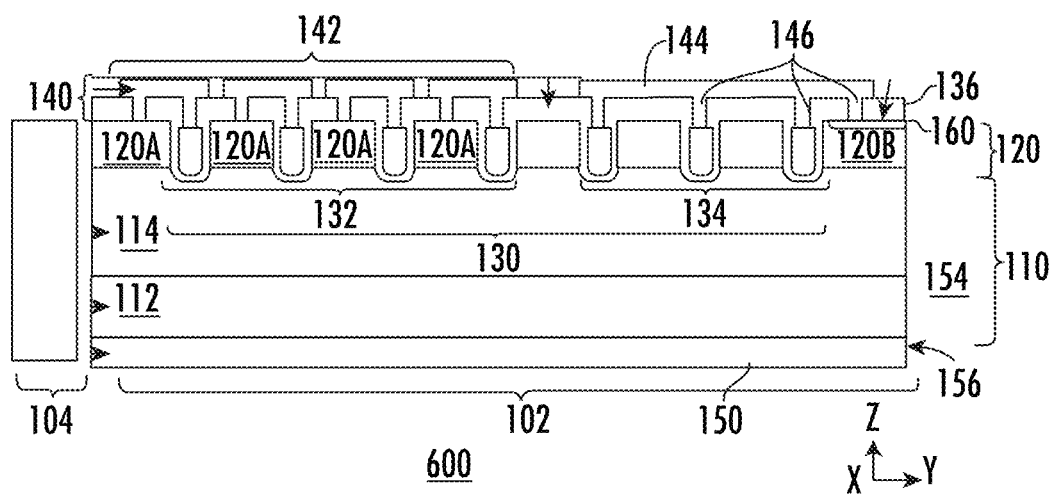
FIG. 6 shows a side cross-section view of a portion of another power semiconductor device according to various embodiments of the disclosure.

FIG. 6 shows a side cross-section view of a portion of another power semiconductor device according to various embodiments of the disclosure. In this embodiment, the device 600 may include the same features as power semiconductor device 100, with the addition of an N+ peripheral layer 160, where the N+ peripheral layer 160 may be implanted in an implant operation where an N+ source region is formed in the active device region 104. Electrically, the N+ peripheral layer may generate the same result as embodiments without the N+ peripheral layer. This arrangement of a peripheral layer may provide a more convenient chip design layout.

Figure 7:
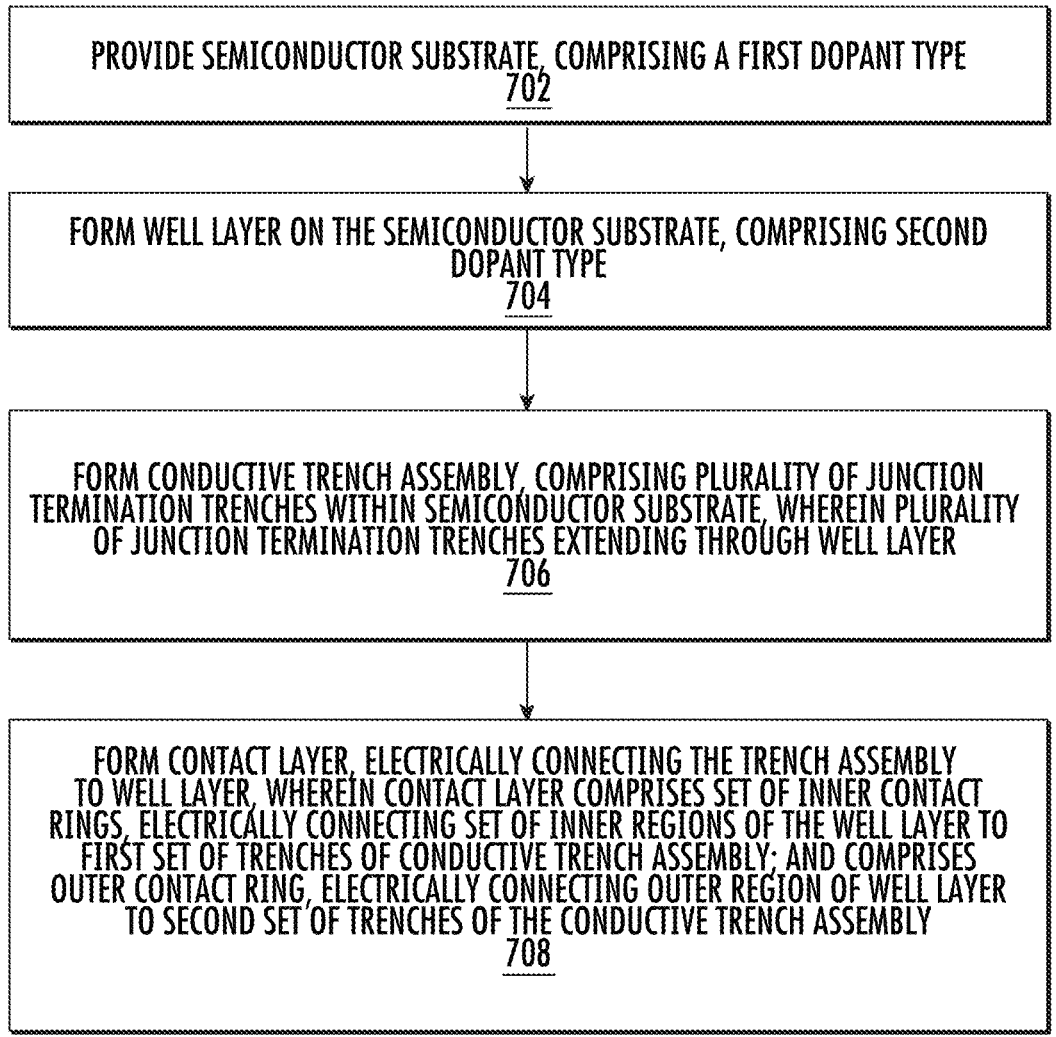
FIG. 7 depicts an exemplary process flow according to embodiments of the disclosure.

FIG. 7 depicts an exemplary process flow 700 according to embodiments of the disclosure. At block 702 a semiconductor substrate is provided, comprising a first dopant type. According to some embodiments, the semiconductor substrate may be an N-type dopant. In various embodiments, the semiconductor substrate may be arranged as a layer stack including a more heavily doped substrate layer, and a more lightly doped epitaxial layer.

At block 704 a well layer is formed on the semiconductor substrate, where the well layer is formed of a second dopant type, opposite the first dopant type.

At block 706, a conductive trench assembly is formed, including a plurality of junction termination trenches within the semiconductor substrate. The plurality of junction termination trenches may extend through the well layer to the semiconductor substrate. The conductive trench assembly may be formed using a trench mask to define openings in the well layer that are subsequently etched and filled with a conductor, such as doped polysilicon.

At block 708, a metal layer is formed, electrically connecting the trench assembly to the well layer. The metal layer may include a set of inner metal contacts, electrically connecting set of inner regions of the well layer to first set of trenches of conductive trench assembly. In addition, the metal layer may be formed with an outer metal contact, electrically connecting the outer region of the well layer to a second set of trenches of the conductive trench assembly. In some embodiments, the outer metal contact may connect the outer region of the well layer to two or more conductive trenches that are located on the outermost portion of the semiconductor substrate.

Figure 8:
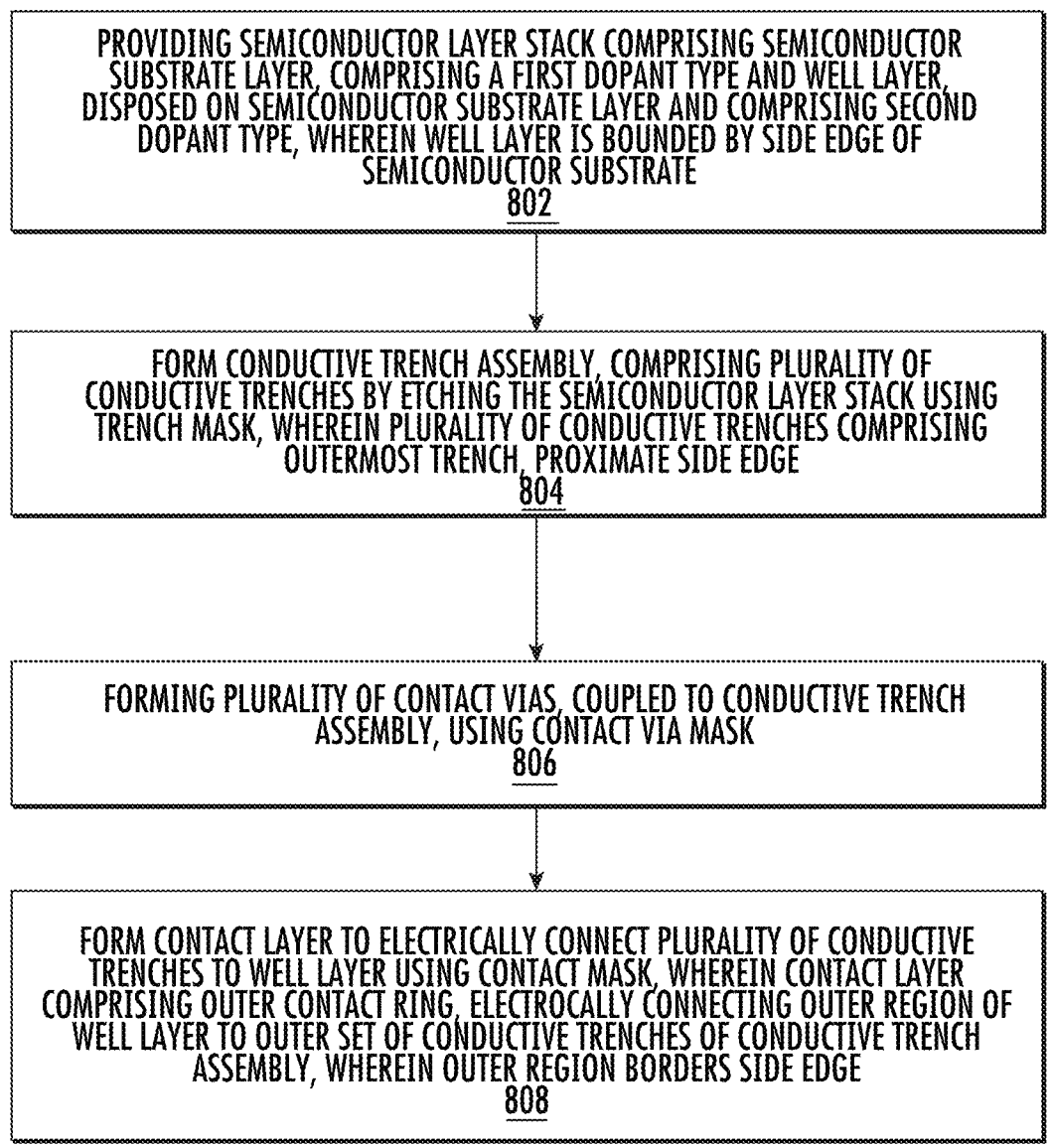
FIG. 8 depicts another process flow, according to embodiments of the disclosure.

FIG. 8 depicts another process flow 800, according to embodiments of the disclosure. At block 802 a semiconductor layer stack is provided in a semiconductor substrate. The semiconductor layer stack may include a semiconductor substrate layer, formed of a first dopant type, such as a N-type dopant, and a well layer, disposed on the semiconductor substrate layer, and formed of a second dopant type, opposite the first dopant type. As such, the well layer may extend to a side edge of the semiconductor substrate. In various embodiments, the side edge of the semiconductor substrate may be formed by scribing of a semiconductor wafer.

At block 804, a conductive trench assembly is formed on the semiconductor layer stack. The conductive trench assembly may include a plurality of conductive trenches that are formed by etching a top surface of the semiconductor layer stack using a trench mask, such as etching a plurality of trenches through the well layer. The plurality of trenches may then be filled with a conductor, to form the plurality of conductive trenches. As such, the plurality of conductive trenches may include an outermost trench, proximate the side edge of the semiconductor substrate.

According to various embodiments, the conductive trench assembly may be arranged as a series of concentric conductive trenches that surround an active device region, such as a MOSFET or IGBT device region.

At block 806, a plurality of contact vias are formed using a contact via mask. As such, the contact vias may be aligned to couple to the conductive trench assembly. The contact vias may be formed by etching through openings in the contact via mask to form vias in an insulator layer formed above the conductive trench assembly. In addition, an outermost contact via may be formed to couple to an outer region of the well layer, adjacent the side edge of the semiconductor substrate.

At block 808 a metal layer is formed to electrically connect the plurality of conductive trenches to the well layer using a metal mask. The metal mask may include a series of ring-shaped openings to form a series of metallic rings in a metal layer, including a series of inner rings and an outer metal contact in the metal layer. The outer metal contact may cover a set of outer vias that extend to an outer set of conductive trenches. The outer metal contact may also cover an outermost via that couples to the outer region of the well layer. As such, the outer metal contact may form metallic material within the outer vias and outermost via to electrically connect the outer region of well layer to the outer set of conductive trenches of conductive trench assembly.

While the present embodiments have been disclosed with reference to certain embodiments, numerous modifications, alterations and changes to the described embodiments are possible while not departing from the sphere and scope of the present disclosure, as defined in the appended claims.

Accordingly, the present embodiments are not to be limited to the described embodiments, and may have the full scope defined by the language of the following claims, and equivalents thereof.

What is claimed is:

1. A method of forming a power semiconductor device, comprising:
providing a semiconductor substrate, comprising a first dopant type, and having a side edge;
forming a well layer on the semiconductor substrate, comprising a second dopant type;
forming a conductive trench assembly, comprising a plurality of junction termination trenches within the semiconductor substrate, the plurality of junction termination trenches extending through the well layer; and
forming a metal layer, electrically connecting the trench assembly to the well layer, wherein the metal layer comprises:
a set of inner metal contacts, electrically connecting a set of inner regions of the well layer to a first set of trenches of the conductive trench assembly; and
an outer metal contact, the outer metal contact electrically connecting an outer region of the well layer to a second set of trenches of the conductive trench assembly, wherein the outer region borders the side edge;
the set of inner metal contacts and the outer metal contact comprising a plurality of metallic rings, arranged in concentric fashion.

2. The method of claim 1, wherein the substrate comprises a N-doped layer, and the well layer comprises a p-doped layer.

3. The method of claim 1, wherein the conductive trench assembly comprises two to four conductive trenches.

4. The method of claim 3, the power semiconductor device comprising a breakdown voltage of 200 V.

5. The method of claim 1, comprising forming at least one metal oxide semiconductor field effect transistor (MOSFET) in an active device region of the power semiconductor device, adjacent to the conductive trench assembly.

6. The method of claim 1, the conductive trench assembly comprising a plurality of poly silicon trenches.

7. A method of forming a power semiconductor device in a semiconductor substrate, comprising:
providing a semiconductor layer stack, comprising:
a semiconductor substrate layer, comprising a first dopant type;
a well layer, disposed on the semiconductor substrate, and comprising a second dopant type, wherein the well layer is bounded by a side edge of the semiconductor substrate;
forming a conductive trench assembly, comprising a plurality of conductive trenches by etching the semiconductor layer stack using a trench mask, the plurality of conductive trenches comprising an outermost trench, proximate the side edge;
forming a plurality of metal vias, coupled to the conductive trench assembly, using a metal via mask; and
forming a metal layer to electrically connect the plurality of conductive trenches to the well layer using a metal mask, the metal layer comprising:
an outer metal contact, electrically connecting an outer region of the well layer to an outer set of conductive trenches of the conductive trench assembly, wherein the outer region borders the side edge; and
a set of inner metal contacts, electrically connecting a set of inner regions of the well layer to a set of inner trenches of the conductive trench assembly;
the set of inner metal contacts and the outer metal contact comprising a plurality of metallic rings, arranged in concentric fashion.

8. The method of claim 7, wherein a first set of contact vias are disposed in communication with the plurality of conductive trenches, and wherein an outermost contact via is disposed in contact with the outer region of the well layer.

9. The method of claim 7, wherein the well layer is formed of a p-type dopant, the method further comprising forming an $N^+$ peripheral layer over the outer region of the well layer.

10. The method of claim 9, wherein the forming the $N^+$ peripheral layer comprises implanting the $N^+$ dopants in a region of the well layer to form an $N^+$ peripheral layer, simultaneously with implanting $N^+$ dopants to form a source in an active area of the power semiconductor device.

* * * * *